(12) United States Patent
Sung et al.

(10) Patent No.: US 9,613,962 B2
(45) Date of Patent: Apr. 4, 2017

(54) FIN LINER INTEGRATION UNDER AGGRESSIVE PITCH

(71) Applicant: GLOBALFOUNDRIES Inc., Grand Cayman (KY)

(72) Inventors: Min Gyu Sung, Latham, NY (US); Neeraj Tripathi, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/172,201

(22) Filed: Jun. 3, 2016

(65) Prior Publication Data
US 2017/0062429 A1    Mar. 2, 2017

Related U.S. Application Data

(62) Division of application No. 14/835,786, filed on Aug. 26, 2015, now Pat. No. 9,385,189.

(51) Int. Cl.
| | |
|---|---|
| H01L 21/02 | (2006.01) |
| H01L 21/8238 | (2006.01) |
| H01L 29/161 | (2006.01) |
| H01L 29/16 | (2006.01) |
| H01L 27/092 | (2006.01) |
| H01L 29/66 | (2006.01) |
| H01L 21/311 | (2006.01) |
| H01L 29/06 | (2006.01) |
| H01L 29/165 | (2006.01) |
| H01L 29/167 | (2006.01) |
| H01L 29/10 | (2006.01) |

(52) U.S. Cl.
CPC ...... *H01L 27/0924* (2013.01); *H01L 21/0217* (2013.01); *H01L 21/02123* (2013.01); *H01L 21/02164* (2013.01); *H01L 21/823821* (2013.01); *H01L 29/1083* (2013.01); *H01L 29/165* (2013.01); *H01L 29/167* (2013.01)

(58) Field of Classification Search
None
See application file for complete search history.

(56) References Cited

U.S. PATENT DOCUMENTS

| | | | |
|---|---|---|---|
| 2006/0284157 A1* | 12/2006 | Chen | ...... H01L 45/06 257/2 |
| 2009/0101982 A1* | 4/2009 | Nagatomo | ...... H01L 21/823807 257/368 |
| 2011/0108920 A1 | 5/2011 | Basker et al. | |

(Continued)

*Primary Examiner* — Khaja Ahmad
(74) *Attorney, Agent, or Firm* — Ditthavong & Steiner, P.C.

(57) ABSTRACT

A method of forming a fin liner and the resulting device are provided. Embodiments include forming silicon (Si) fins over negative channel field-effect transistor (nFET) and positive channel field-effect transistor (pFET) regions of a substrate, each of the Si fins having a silicon nitride (SiN) cap; forming a SiN liner over the Si fins and SiN caps; forming a block mask over the pFET region; removing the SiN liner in the nFET region; removing the block mask in the pFET region; forming a diffusion barrier liner over the Si fins; forming a dielectric layer over and between the Si fins; planarizing the dielectric layer down to the SiN caps in the nFET region; and recessing the dielectric layer to expose an upper portion of the Si fins.

20 Claims, 13 Drawing Sheets

(56) References Cited

U.S. PATENT DOCUMENTS

2012/0241818 A1\* 9/2012 Kavalieros ........ H01L 29/66795
              257/192
2014/0106528 A1   4/2014 Quyang et al.
2014/0231919 A1\* 8/2014 Peng ................ H01L 21/76224
              257/368

\* cited by examiner

FIN LINER INTEGRATION UNDER AGGRESSIVE PITCH

RELATED APPLICATION

The present application is a Divisional of application Ser. No. 14/835,786, filed on Aug. 26, 2015, the disclosure of which is incorporated herein by reference in their entirety.

TECHNICAL FIELD

The present disclosure relates to the manufacture of semiconductor devices including fin-shaped field effect transistors (finFET). In particular, the present disclosure relates to a fin liner used in manufacturing a semiconductor device in the 14 nanometer (nm) technology node and beyond.

BACKGROUND

A finFET includes a narrow source-channel-drain region (the fin) around which is formed a gate. Activation of the gate, source and drain facilitates current drivability in the channel between the source and the drain, thereby facilitating operation of the finFET. Defects in the channel regions of the fins, such as dislocation and stacking fault-like defects, can arise when punch through stop (PTS) implant is performed. Moreover, during reactive ion etching (RIE) of the fins, the positive channel field-effect transistor (pFET) fins end up being smaller than the negative channel field-effect transistor (nFET) fins due to the faster etch rate of the pFET fins formed of silicon germanium (SiGe). Further, punch through leakage is a main component of off-state leakage in bulk finFETs, and it is usually suppressed by forming various punch through stop liners. The punch through is a leakage current between the source and drain in a transistor, so that it is more vulnerable in a short channel device where the distance between source and drain is short. That is, the closer the distance, the larger punch through leakage current. Various liners, such as silicon nitride (SiN), silicon dioxide ($SiO_2$)/silicon nitride (SiN), and $SiO_2$/siliconborocarbonitride (SiBCN) have been used, but can affect device performance.

A need therefore exists for methodology enabling elimination of the PTS implant, prevention of channel damage, elimination of a lithography step to simplify integration, improved nFET and pFET short channel (SC) performance, and better gap fill friendly integration than borosilicate glass (BSG) and phosphosilicate glass (PSG) schemes and the resulting devices.

SUMMARY

An aspect of the present disclosure includes a more simplified methodology that eliminates a lithography step and channel damage by foregoing PTS implanting, while maintaining device performance.

Another aspect of the present disclosure is a device having no channel damage caused by PTS implants and, therefore, improved nFET and pFET SC performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming silicon (Si) fins over nFET and pFET regions of a substrate, each of the Si fins having a SiN cap; forming a SiN liner over the Si fins and SiN caps; forming a block mask over the pFET region; removing the SiN liner in the nFET region; removing the block mask in the pFET region; forming a diffusion barrier liner over the Si fins; forming a dielectric layer over and between the Si fins; planarizing the dielectric layer down to the SiN caps in the nFET region; and recessing the dielectric layer to expose an upper portion of the Si fins.

Aspects include the diffusion barrier liner including SiBCN. Other aspects include removing the SiN cap and SiBCN from the exposed upper portion of the Si fins with a hot phosphorous treatment. Still further aspects include the dielectric layer including silicon dioxide ($SiO_2$). Additional aspects include annealing the $SiO_2$ layer to densify the $SiO_2$ layer. Other aspects include the Si fins in the pFET region including silicon germanium adjacent an upper portion of the Si fins. Further aspects include the Si fins in the nFET region being larger than the Si fins in the pFET region. Yet other aspects include oxidizing exposed regions of the Si fins in the nFET region with an in-situ steam generation (ISSG) process to form a 1 nanometer (nm) thick liner of $SiO_2$, wherein the Si fins in the nFET region are the same size as the Si fins in the pFET region following the ISSG process. Another aspect includes forming an optical planarization layer (OPL) over the nFET and pFET regions and an anti-reflective coating (ARC) over the OPL. Additional aspects include removing the OPL in the pFET region by wet etching. Other aspects include planarizing the dielectric layer by chemical mechanical polishing (CMP).

Another aspect of the present disclosure is a device including: Si fins formed over nFET and pFET regions of a substrate; a $SiO_2$ liner over the Si fins in the nFET region; a dielectric layer disposed between a lower portion of the Si fins, leaving an exposed upper portion of the Si fins; and a SiBCN liner disposed between the Si fins and the dielectric layer and on a bottom surface of the dielectric layer.

Aspects include the exposed upper portion of the Si fins in the pFET region including SiGe. Other aspects include the $SiO_2$ liner in the nFET region being disposed between the SiBCN liner and the Si fins. Further aspects include the $SiO_2$ liner having a thickness of 1 nm on opposing sides of the Si fins. Additional aspects include a SiN liner disposed on the Si fins in the pFET region between the SiBCN liner and the Si fins. Another aspect includes the nFET channel region is being doped with boron (B). Another aspect includes the dielectric layer including $SiO_2$.

Another aspect of the present disclosure is a method including: forming Si fins, each having a SiN cap, over nFET and pFET regions of a substrate, the Si fins in the pFET region including a SiGe portion below the SiN cap, and the Si fins in the nFET region being larger than the Si fins in the pFET region; depositing a SiN liner over the Si fins and SiN caps; depositing an OPL over the nFET and pFET regions and an ARC over the OPL in the pFET region; etching the OPL in the nFET region to remove the SiN liner in the nFET region; removing the OPL in the pFET region; oxidizing exposed regions of the Si fins in the nFET region; depositing a SiBCN liner over the Si fins; depositing a $SiO_2$ layer over and between the Si fins; planarizing the $SiO_2$ layer down to the SiN caps of the nFET region with CMP; recessing the $SiO_2$ layer to expose an upper portion of the Si fins; and removing the SiN liner and SiBCN liner from the exposed upper portion of the Si fins in the nFET region.

Aspects include removing the SiN cap and SiBCN from the exposed upper portion of the Si fins with a hot phosphorous treatment.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of channel damage caused by PTS implanting and deterioration of performance caused by fin liners.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
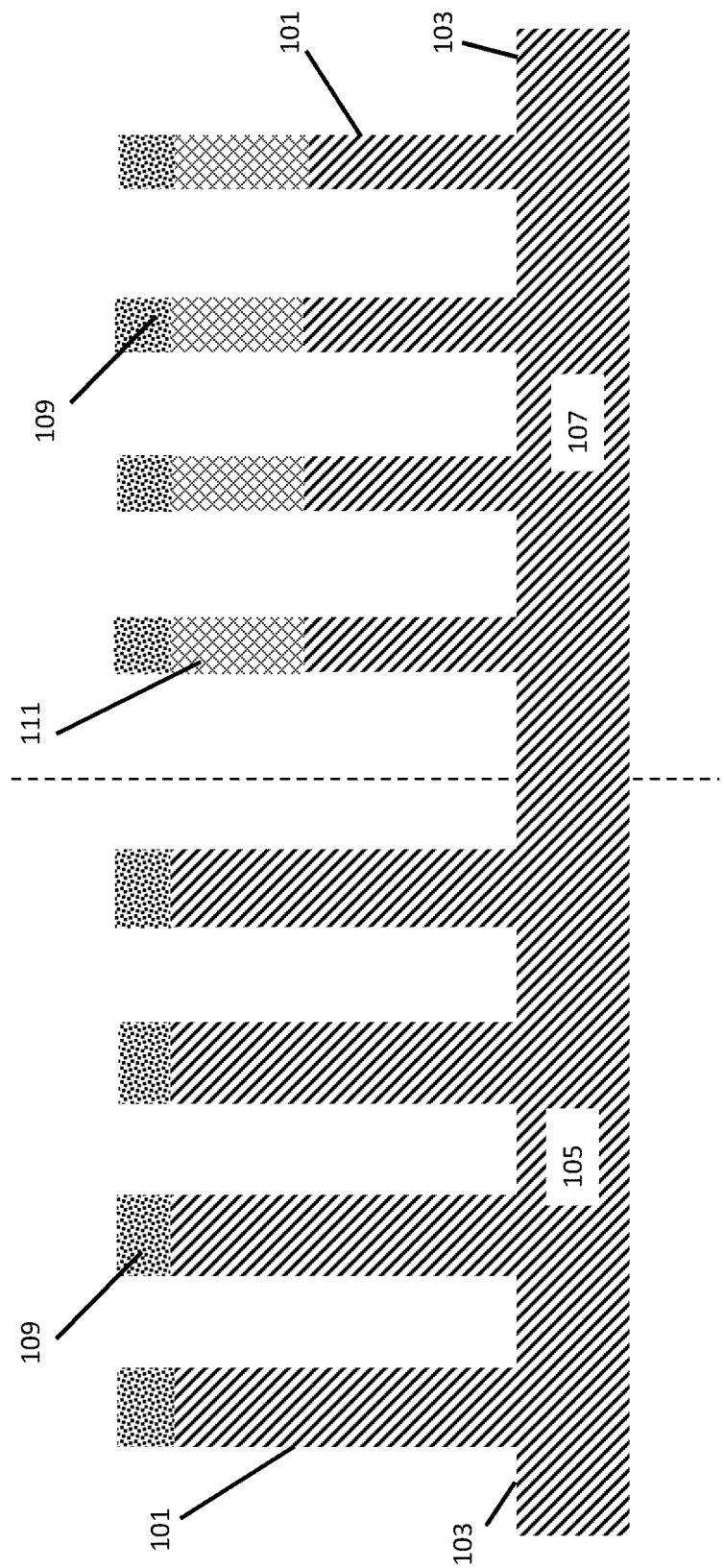
FIGS. 1 through 13 illustrate, in cross sectional view, a process flow to produce a liner over fins, in accordance with an exemplary embodiment.

Adverting to FIG. 1, fins 101 are formed over substrate 103. Substrate 103 includes a Si substrate. Other examples of materials that may be suitable for use in the substrate 103 include silicon-on-insulator (SOI), SiGe, germanium (Ge), and/or compound semiconductor materials. Processes, such as, photolithography and etch processes, can be used to create the fins 101. The fins 101 may include silicon.

The fins 101 include the channels of a finFET. The fins 101 may be coupled to the source/drain regions of the finFET. A gate structure (not shown for illustrative convenience) can be formed on and over the fins 101 and spacers may be provided on sides of the gate structure. The gate structure may include polysilicon, silicon-germanium, a metal including metal compounds such as Mo, Cu, W, Ti, Ta, TiN, TaN, NiSi, CoSi, and/or other suitable conductive materials.

In the example of FIG. 1, the fins 101 formed over nFET channel region 105 of substrate 103 an doped with p-type dopants including boron (B). A positively doped channel is formed in nFET channel region 105. The fins 101 formed over pFET channel region 107 of substrate 103 are to be doped with n-type dopants including phosphorous (P). A negatively doped channel is formed in pFET channel region 107.

A SiN protective cap 109 is formed over the fins 101. The fins in the pFET channel region 107 can be formed exclusively of Si or optionally include an upper region 111 of the fins 101 formed of SiGe. As shown in FIG. 1, the fins 11 of the pFET region are narrower than the fins in the nFET region since the SiGe has a higher etch rate than Si alone.

Figure 2:
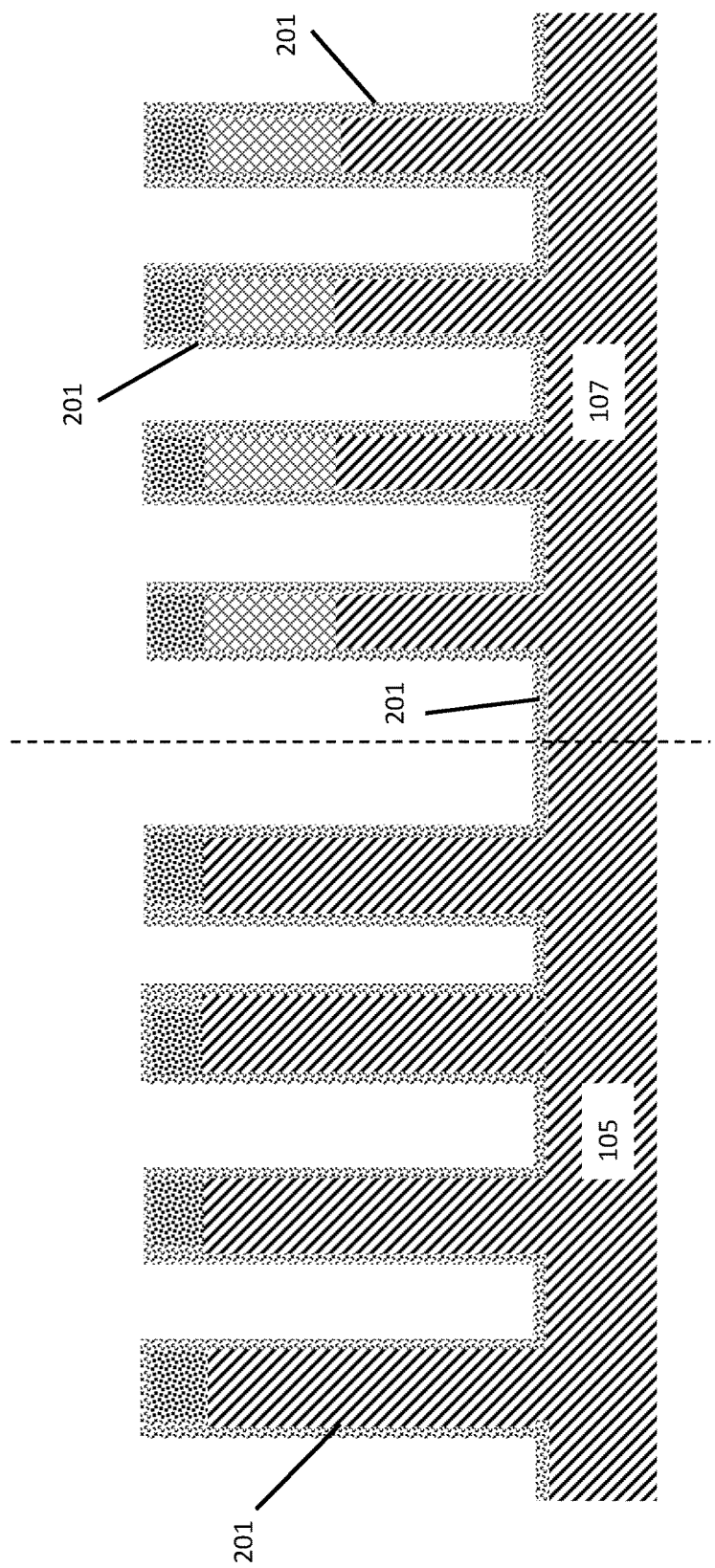

Adverting to FIG. 2, a SiN liner 201 is formed over the Si fins 101 and SiN caps 109. The SiN liner 201 can be deposited by atomic layer deposition (ALD). As a result, a beneficial positive charge is created on the pFET channel region 107, which can reduce punch through.

Figure 3:
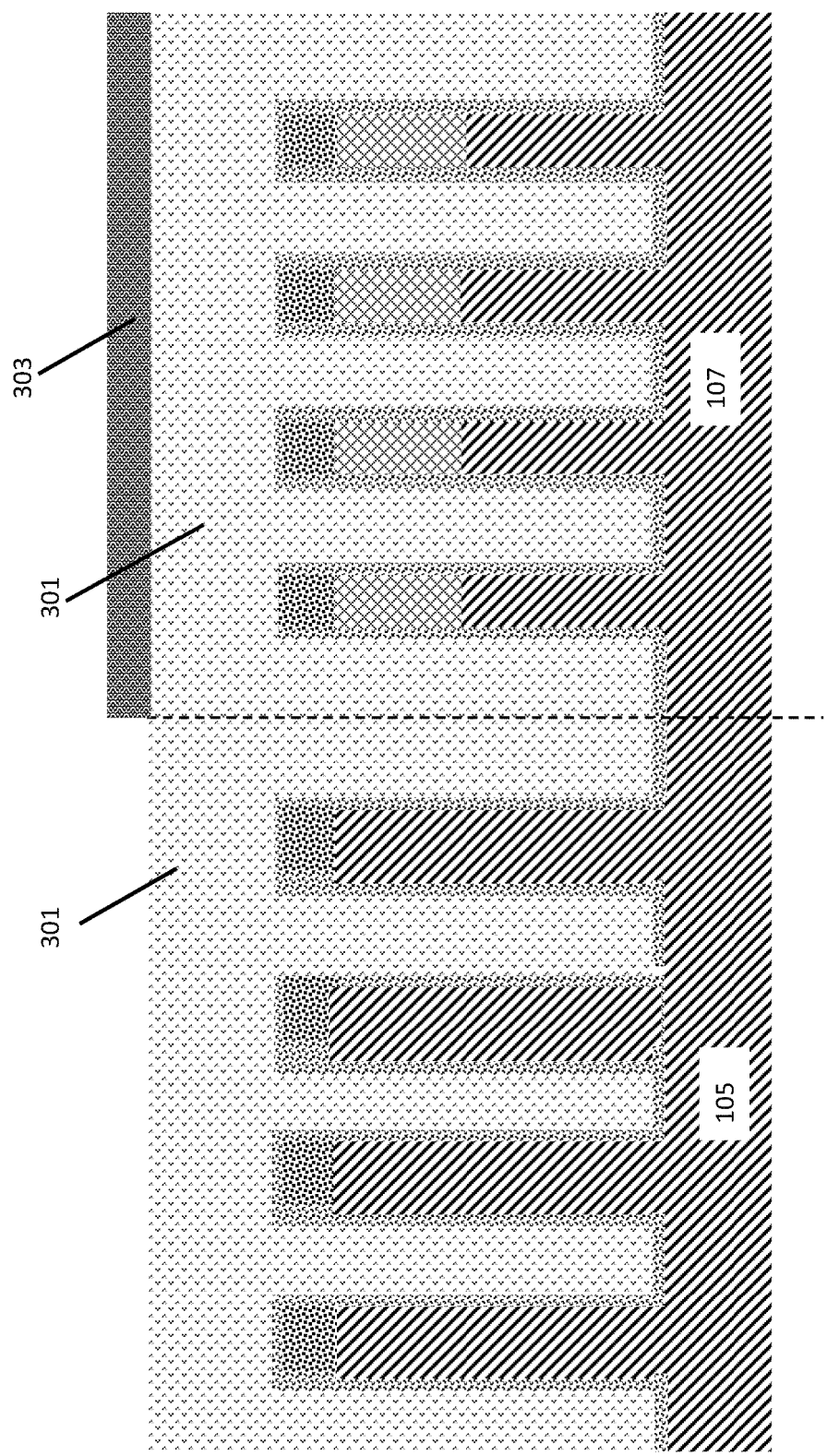
Figure 4:
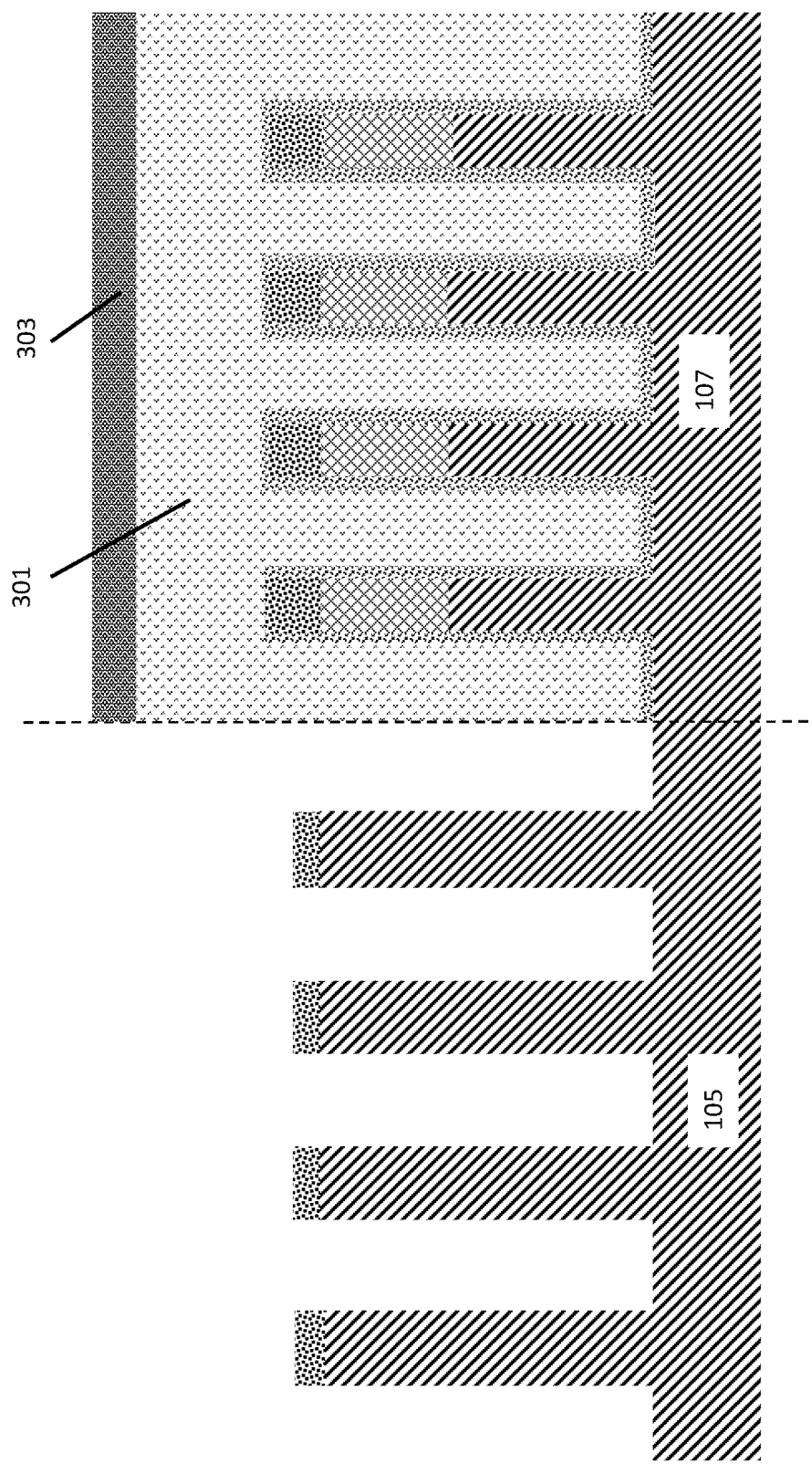
Figure 5:
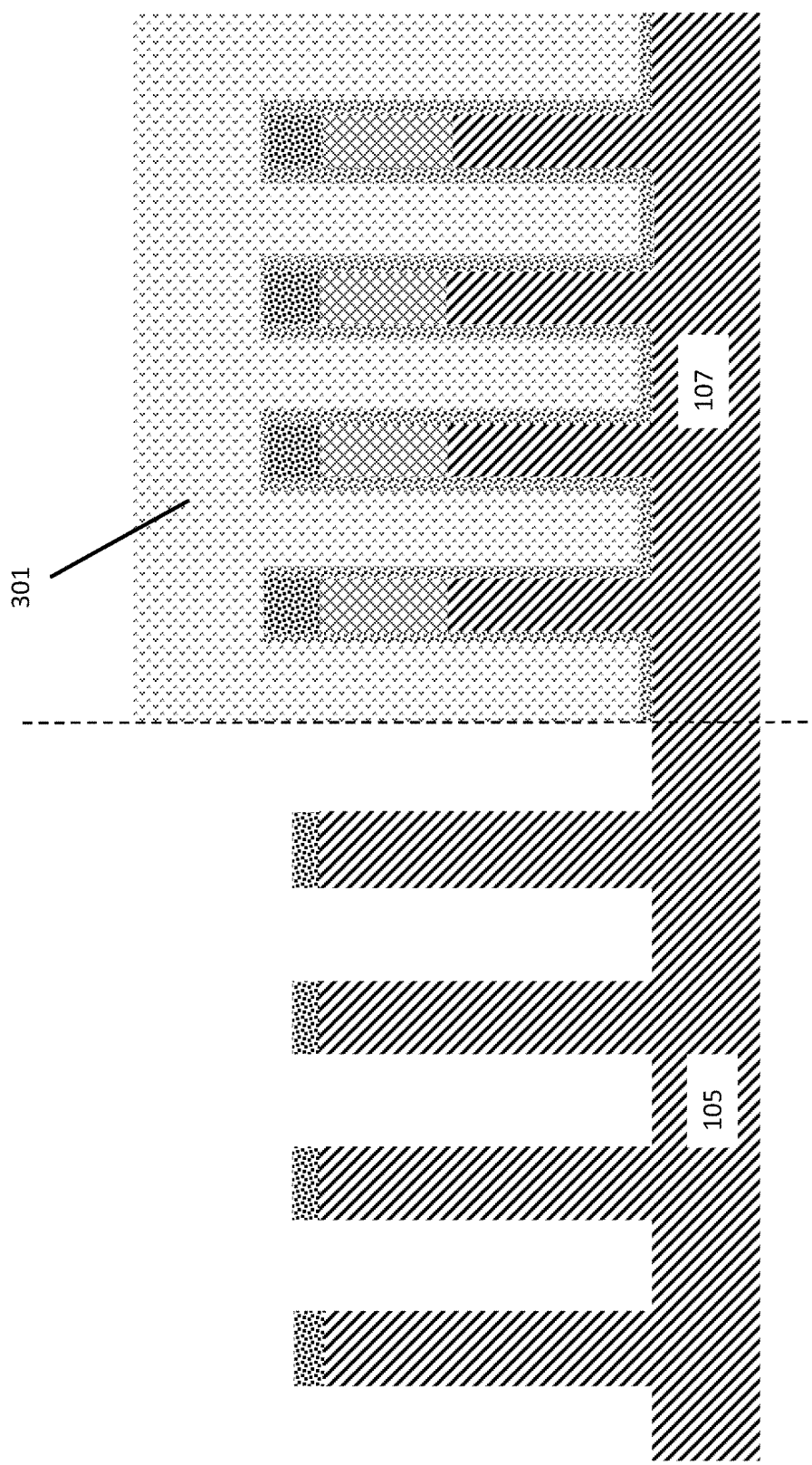
Figure 6:
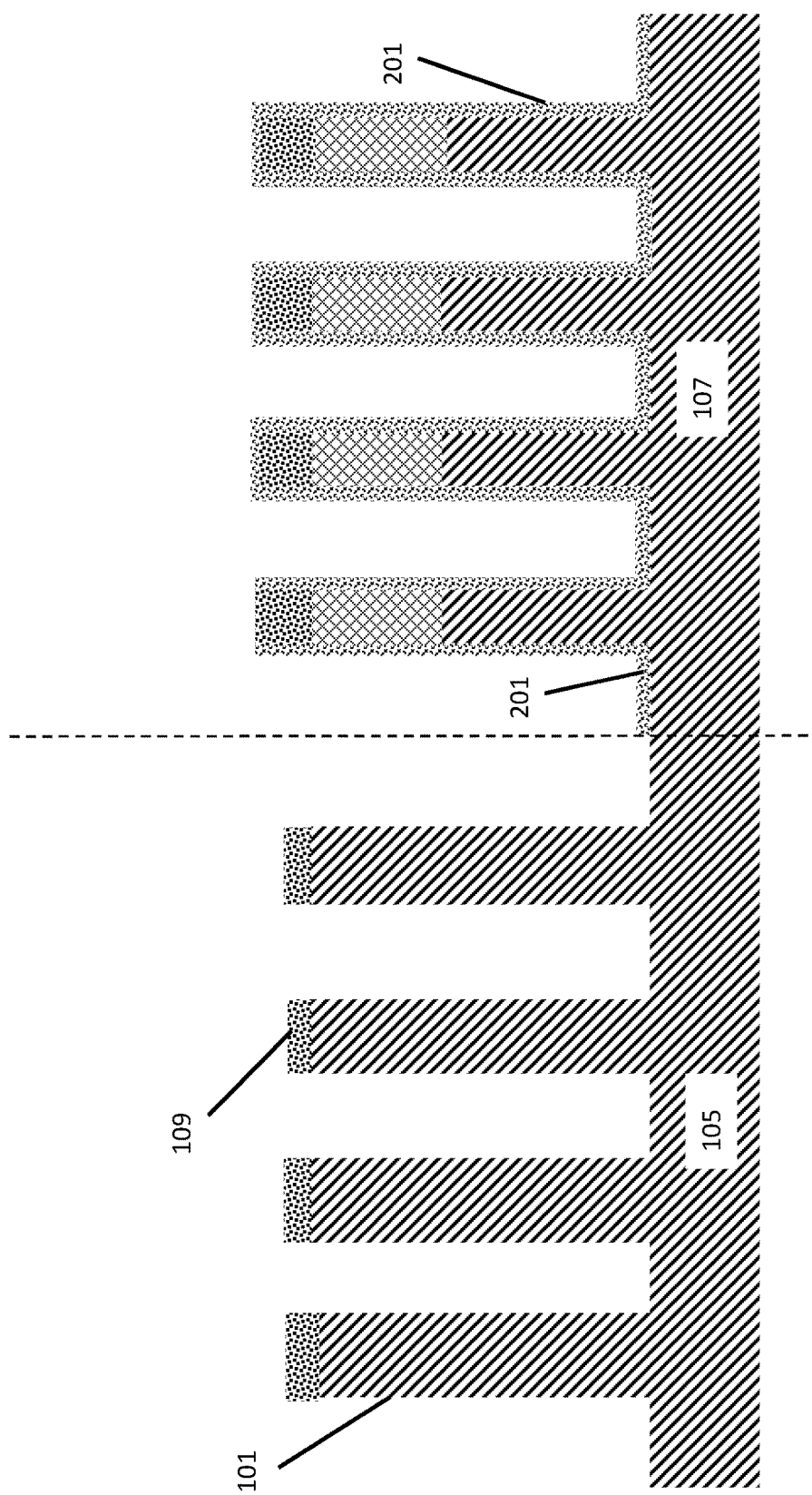

Adverting to FIG. 3, a block mask is formed and includes a step of depositing an OPL 301 over the nFET and pFET channel regions 105 and 107 and an ARC 303, such as a SiARC, is deposited over the OPL 301 in the pFET channel region 107. As shown in FIG. 4, a dry etching step is performed to remove the OPL 301 in the nFET channel region 105. Following the dry etching step, a RIE step is performed to remove the SiN liner 201 from the fins 101 in the nFET channel region 105. An upper portion of the SiN caps 109 in the nFET region 105 is lost during the RIE step such that the height of the fins 101 in the nFET channel region is less than the height of the fins 101 in the pFET channel region 107. As illustrated in FIG. 5, the ARC 303 is removed from the OPL 301 in the pFET channel region 107 by wet etching. In FIG. 6, the OPL 301 is stripped away by a chemical etching, leaving the SiN liner 201 intact over the fins 101 in the pFET channel region 107.

Figure 7:
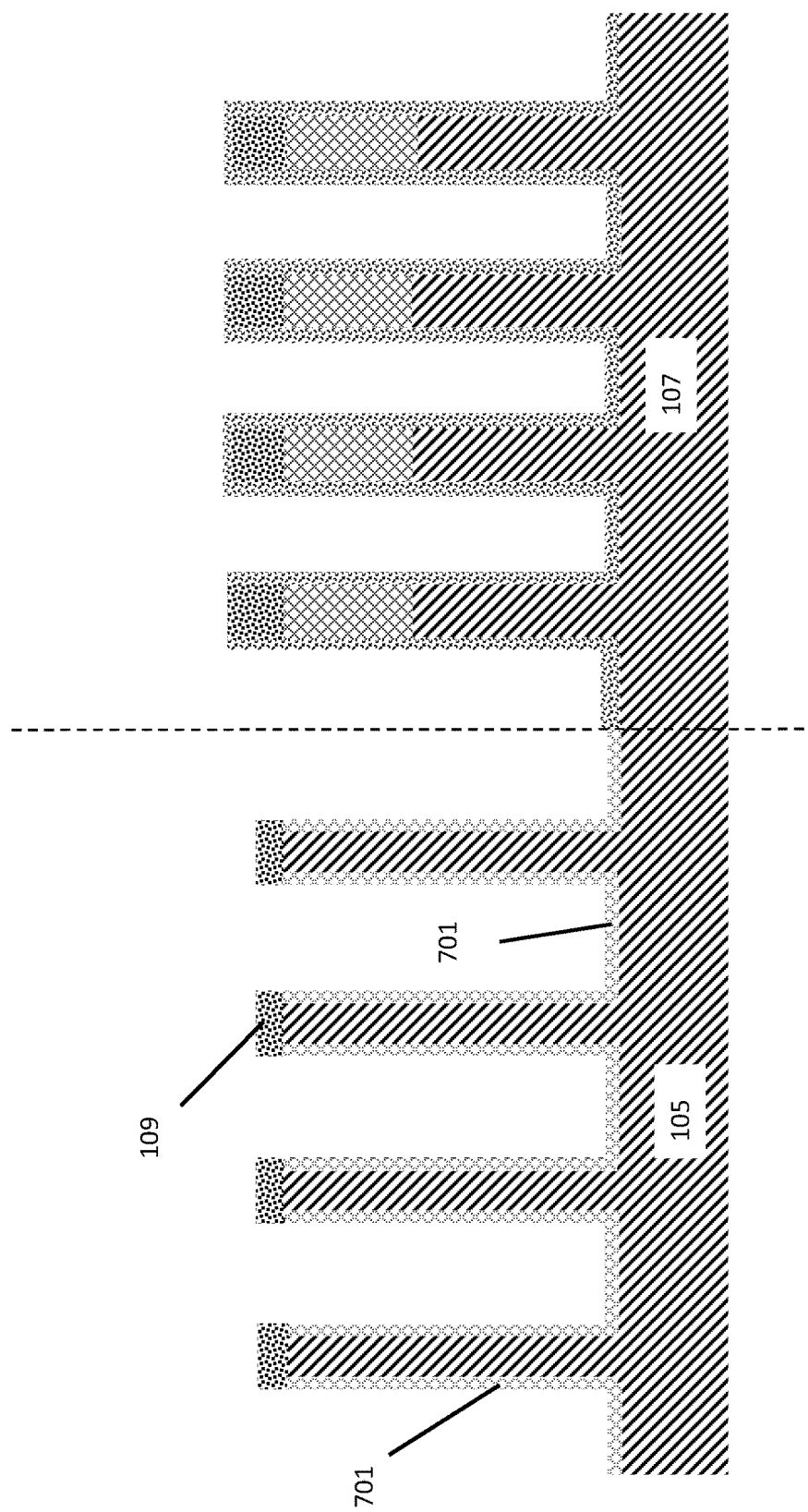

Adverting to FIG. 7, the fins 101 in the nFET channel region 105 are oxidized to form oxidized regions along the sides of the fins 101 and upper surface of the substrate 103. Specifically, exposed regions of the fins 101 in the nFET region are treated with an in-situ steam generation (ISSG) process to form a 1 nanometer (nm) thick liner of silicon dioxide ($SiO_2$) 701. The fins 101 in the nFET channel region 105 are the same size as the fins 101 in the pFET channel region 107 following the ISSG process. The fins 101 in the nFET channel region 105 are reduced during the oxidation such that the size is the same as the fins 101 in the pFET channel region 107. When the critical dimension (CD) of the fins 101 in the nFET region 105 is the same as the CD of the fins 101 in the pFET region 107, no ISSG step is necessary.

Figure 8:
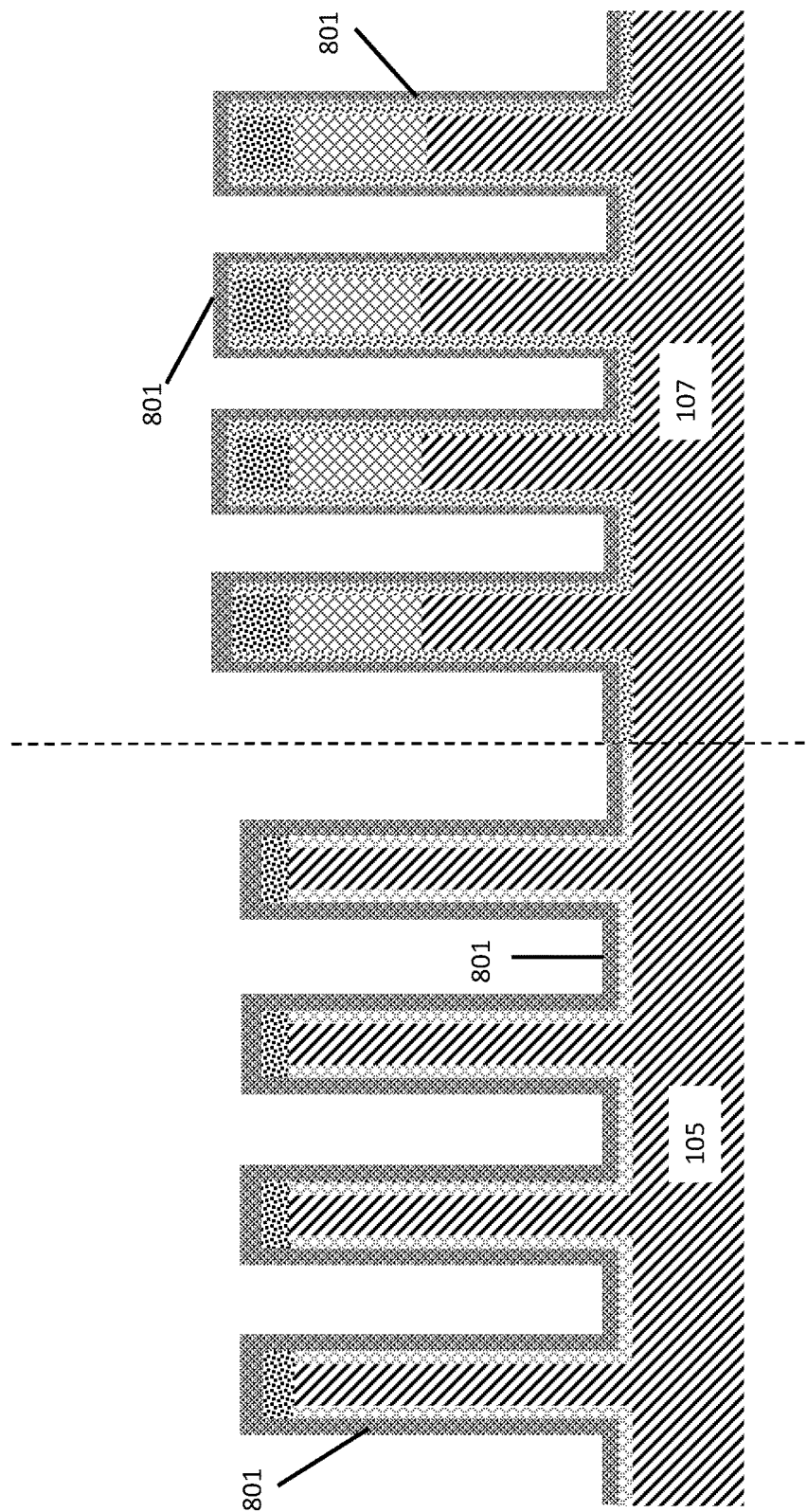
Figure 9:
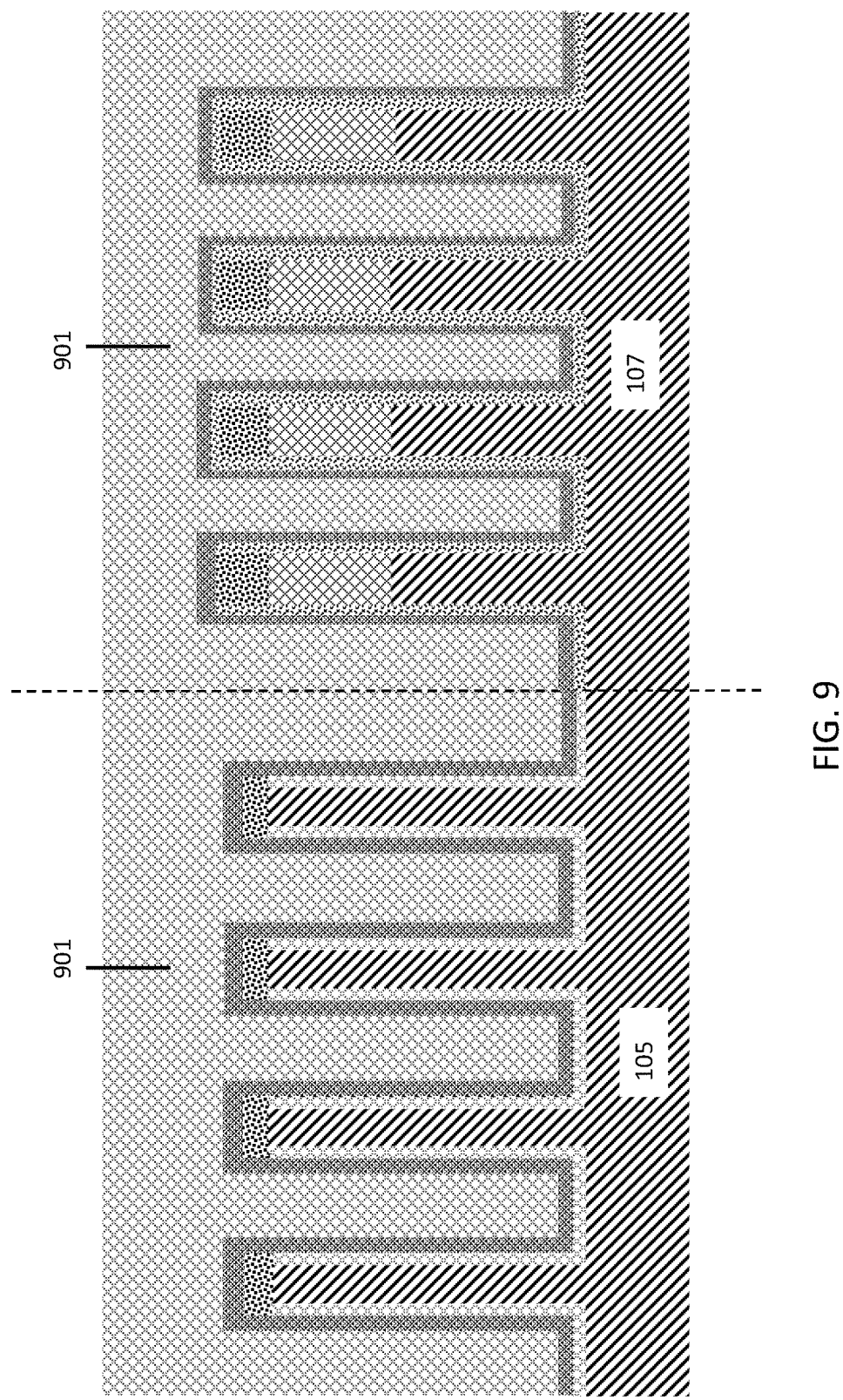

As illustrated in FIG. 8, a SiBCN liner 801 is deposited over the fins 101 in the nFET and pFET channel regions 105 and 107. Boron doping on the fins 101 in the nFET channel region due to the deposition of the SiBCN liner 801 helps reduce punch through. The SiN liner 201 over the fins 101 in the pFET channel region 107 blocks the B diffusion from the SiBCN liner 801. Adverting to FIG. 9, CVD of $SiO_2$ is used to fill the spacing between fins 101 in the nFET and pFET channel regions 105 and 107. Following the CVD, a high temperature steam annealing step is performed to form a densified $SiO_2$ region 901 (dielectric layer) and oxidize the nFET and pFET channel regions 105 and 107. The SiBCN liner 801 prevents oxide diffusion from the $SiO_2$ region 901 during the steam annealing in the nFET and pFET channel regions 105 and 107. The SiN liner 201 on the fins 101 of the pFET channel region 107 provides an additional barrier on fins 101 of the pFET channel region 107. With a thinner SiN cap 109 over the fins 101 of the nFET channel region, a more gap fill friendly region is provided.

Figure 10:
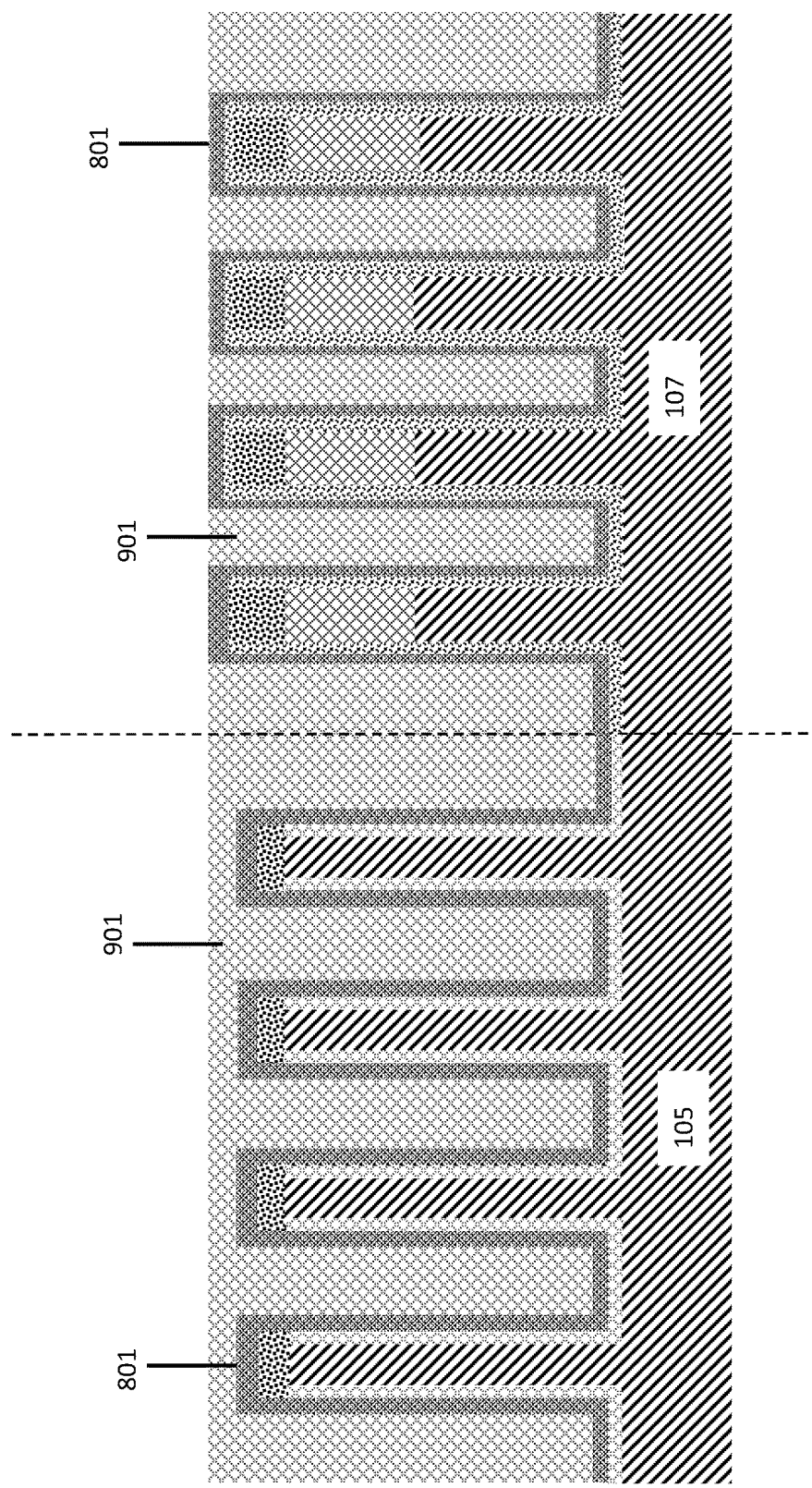
Figure 11:
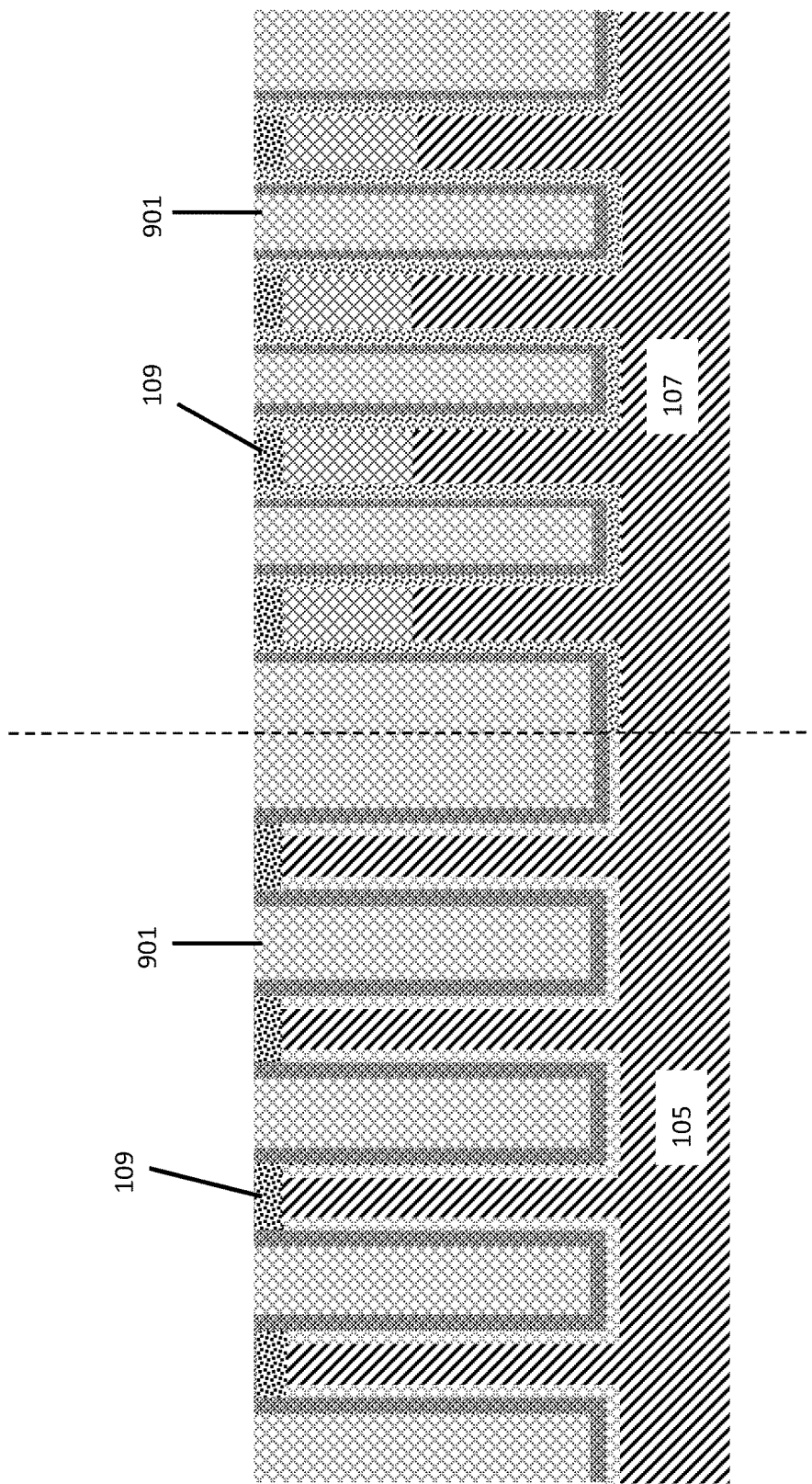

Adverting to FIG. 10, an oxide CMP is performed to remove the excess $SiO_2$ region 901 over the fins 101. The CMP removes/planarizes the $SiO_2$ region 901 down to the upper portion of the SiBCN liner 801 over the fins 101 in the pFET channel region 107. Due to the thinner SiN caps 109 in the nFET channel region 105, a portion of the $SiO_2$ region 901 remains over the tops of the fins 101 in the nFET channel region 105. In FIG. 11, a SiN CMP process is performed such that that the SiN caps 109 in the nFET channel region 105 are exposed.

Figure 12:
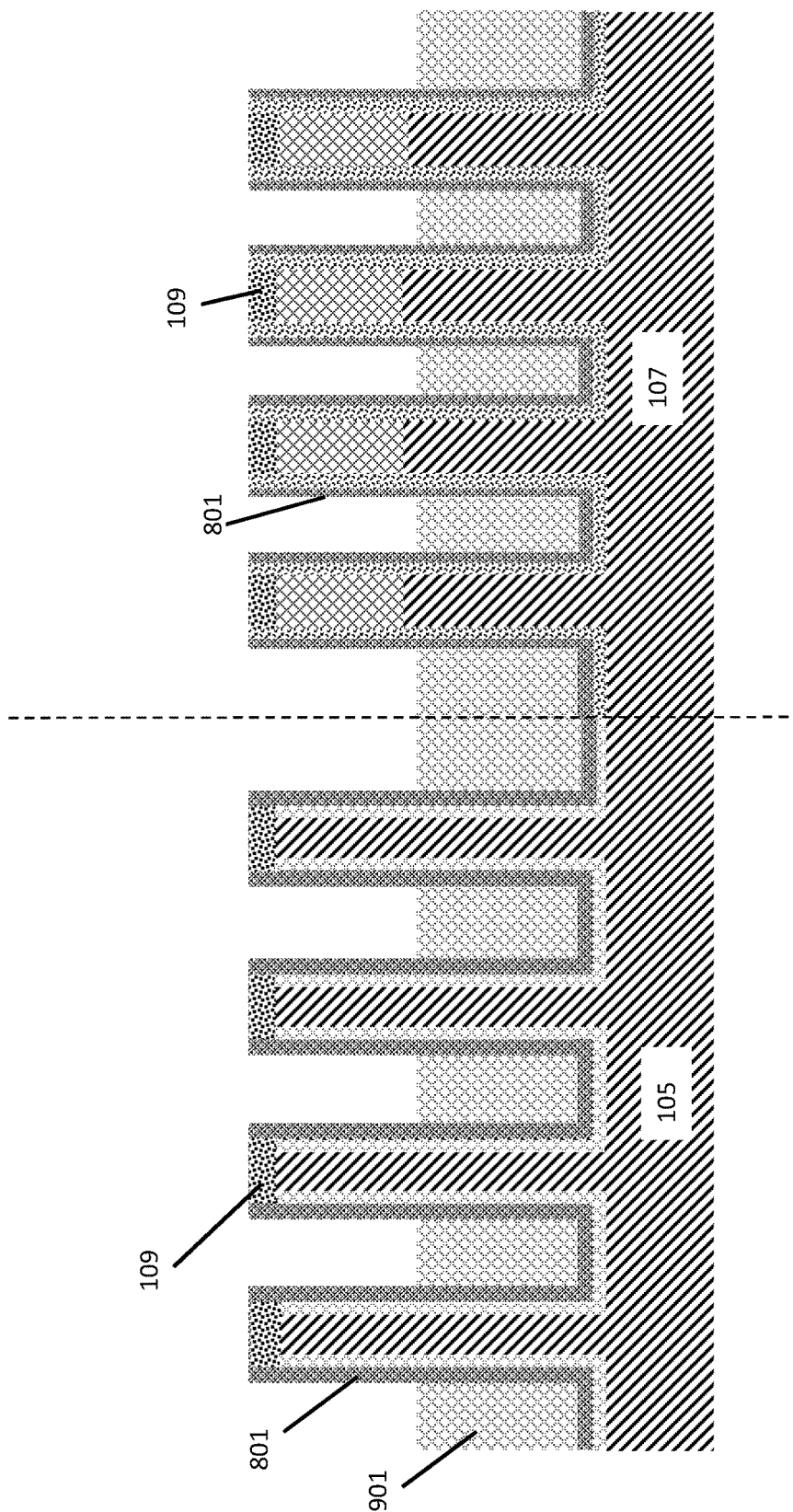
Figure 13:
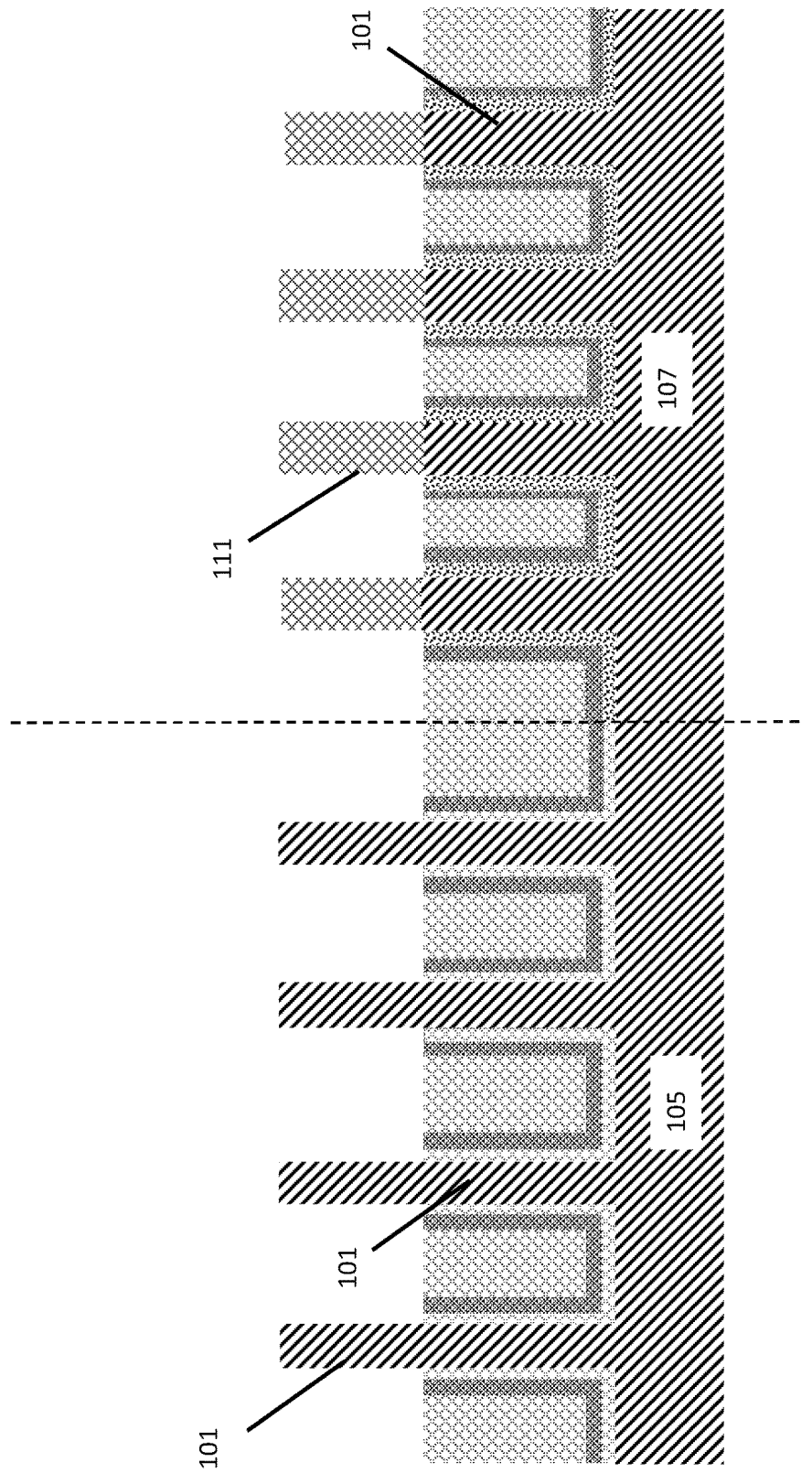

Next, an oxide recess is formed to remove the $SiO_2$ region 901 from regions between the fins 101 in the nFET and pFET channel regions 105 and 107, as illustrate in FIG. 12. This oxide recess exposes the upper portions of the fins 101 which become channel regions of the finFET. In FIG. 13, the exposed upper portions of the fins are subjected to a hot phosphorous treatment to remove the SiN and SiBCN such that only Si fins are exposed above the $SiO_2$ region 901 in the nFET channel region 105, and only the SiGe region 111 of the fins 101 in the pFET channel region 107 are exposed above the $SiO_2$ region 901. Additional processing may continue for the fabrication of one or more gate structures on the substrate 103. A gate structure (not shown for illustrative convenience) can be formed on and over the fins 101.

The embodiments of the present disclosure can achieve several technical effects including reduced punch through, since the SiBCN 801 in the nFET channel region 105 functions as a B implant source and prevents $SiO_2$ diffusion from a field oxide (FOX) region 901 during steam annealing, and elimination of the need for a PTS implant. In addition, the SiBCN 801 performs better than the BSG/PSG scheme which does not function as a diffusion barrier under very small fin pitch requiring flowable CVD (FCVD) and densification annealing. In the pFET channel region 107, the SiN liner 201 provides a positive charge to reduce punch through, and no PTS implant is required. By eliminating the PTS implant for both the nFET and pFET channel regions 105 and 107, the integration becomes simpler, and process costs are reduced.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices having fins with a liner.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   silicon (Si) fins formed over negative channel field-effect transistor (nFET) and positive channel field-effect transistor (pFET) regions of a substrate;
   a silicon dioxide ($SiO_2$) liner over the Si fins in the nFET region;
   a dielectric layer disposed between a lower portion of the Si fins, leaving an exposed upper portion of the Si fins; and
   a siliconborocarbonitride (SiBCN) liner disposed between the $SiO_2$ liner and the dielectric layer, and directly on a bottom surface of the dielectric layer.

2. The device according to claim 1, wherein the exposed upper portion of the Si fins in the pFET region comprises silicon germanium (SiGe).

3. The device according to claim 2, wherein the $SiO_2$ liner in the nFET region is disposed between the SiBCN liner and the Si fins.

4. The device according to claim 3, wherein the $SiO_2$ liner has a thickness of 1 nanometer (nm) on opposing sides of the Si fins.

5. The device according to claim 1, further comprising:
   a SiN liner disposed on the Si fins in the pFET region between the SiBCN liner and the Si fins.

6. The device according to claim 1, wherein the nFET channel region is doped with boron (B).

7. The device according to claim 1, wherein the dielectric layer comprises $SiO_2$.

8. A device comprising:
   silicon (Si) fins formed over negative channel field-effect transistor (nFET) and positive channel field-effect transistor (pFET) regions of a substrate, each of the Si fins having a silicon nitride (SiN) cap;
   an oxide liner formed over the Si fins in the nFET region;
   a silicon dioxide ($SiO_2$) dielectric layer disposed between the Si fins, leaving an exposed upper portion of the Si fins; and
   a diffusion barrier liner disposed between the oxide liner and the $SiO_2$ dielectric layer, and directly on a bottom surface of the $SiO_2$ dielectric layer.

9. The device according to claim 8, wherein the diffusion barrier liner comprises siliconborocarbonitride (SiBCN).

10. The device according to claim 8, wherein the $SiO_2$ dielectric layer is densified by way of annealing.

11. The device according to claim 8, wherein an upper portion of the Si fins in the pFET region comprise silicon germanium (SiGe).

12. The device according to claim 9, wherein the oxide liner comprises $SiO_2$ disposed between the SiBCN liner and the Si fins.

13. The device according to claim 12, wherein the $SiO_2$ liner has a thickness of 1 nanometer (nm) on opposing sides of the Si fins.

14. The device according to claim 8, further comprising:
   a SiN liner disposed on the Si fins in the pFET region between the diffusion barrier liner and the Si fins.

15. The device according to claim 8, wherein the nFET channel region is doped with boron (B).

16. A device comprising:
   silicon (Si) fins formed over negative channel field-effect transistor (nFET) and positive channel field-effect transistor (pFET) regions of a substrate,
   wherein an upper portion of the Si fins in the pFET region comprise silicon germanium (SiGe);
   a silicon dioxide ($SiO_2$) liner over the Si fins in the nFET region;

a SiO$_2$ dielectric layer disposed between a lower portion of the Si fins, leaving an exposed upper portion of the Si fins;

a SiN liner disposed on the Si fins in the pFET region between a diffusion barrier liner and the Si fins; and a siliconborocarbonitride (SiBCN) liner disposed between the SiO$_2$ liner and the SiO$_2$ dielectric layer in the nFET region, between the SiN liner and the SiO$_2$ dielectric layer in the pFET region, and directly on a bottom surface of the SiO$_2$ dielectric layer.

17. The device according to claim 16, wherein the SiO$_2$ liner in the nFET region is disposed between the SiBCN liner and the Si fins.

18. The device according to claim 17, wherein the SiO$_2$ liner has a thickness of 1 nanometer (nm) on opposing sides of the Si fins.

19. The device according to claim 16, wherein the nFET channel region is doped with boron (B).

20. The device according to claim 16, wherein the pFET channel region is doped with phosphorous (P).

* * * * *